(12) United States Patent
Evers

(10) Patent No.: US 6,348,804 B1
(45) Date of Patent: Feb. 19, 2002

(54) VECTOR NETWORK ANALYZER

(75) Inventor: Christian Evers, Kirchheim (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 09/571,280

(22) Filed: May 16, 2000

(30) Foreign Application Priority Data

Jun. 10, 1999 (DE) .......................................... 199 26 454

(51) Int. Cl.[7] .............................................. G01N 22/00
(52) U.S. Cl. ...................................... 324/646; 324/650
(58) Field of Search ................................ 324/650, 638, 324/601, 646, 613

(56) References Cited

U.S. PATENT DOCUMENTS 4,808,912 A * 2/1989 Potter et al. ................. 324/601
5,170,126 A * 12/1992 Wedge et al. ................ 324/613
5,191,294 A * 3/1993 Grace et al. ................. 324/613
5,502,394 A * 3/1996 Piau ............................ 324/646
5,578,932 A * 11/1996 Adamian ..................... 324/601

FOREIGN PATENT DOCUMENTS

| DE | C2-4401068 | 3/1995 |
| DE | A1-19857834 | 10/1999 |

* cited by examiner

Primary Examiner—Safet Metjahic
Assistant Examiner—Vincent Q. Nguyen

(57) ABSTRACT

In a vectorial network analyzer having at least two measuring ports, whose measuring arms respectively have quad gates with the accompanying measuring points, a separate high-frequency generator is associated to each measuring port; with high-frequency signals of these generators being distinguishable from each other and being simultaneously fed to their respective measuring ports.

3 Claims, 1 Drawing Sheet

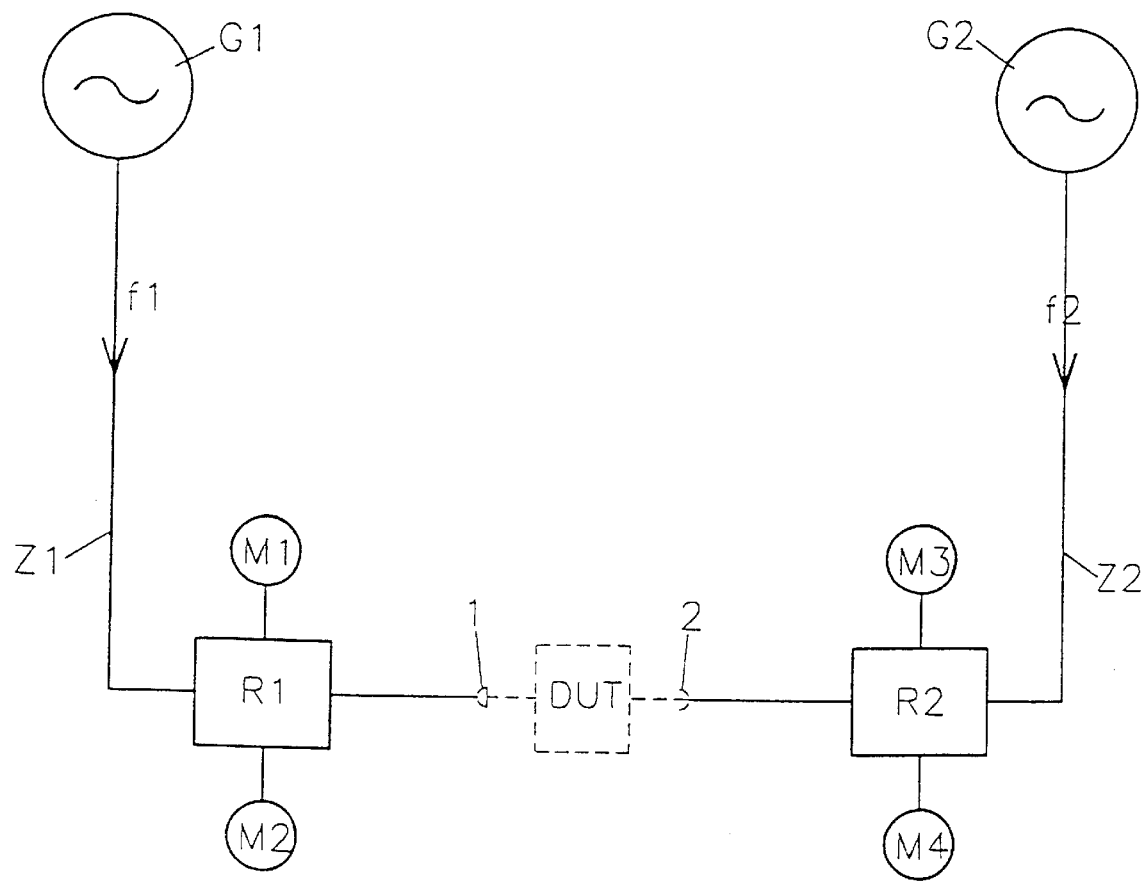

VECTOR NETWORK ANALYZER

BACKGROUND OF THE INVENTION

This application claims a priority based on German patent application 199 26 454.6 filed Jun. 10, 1999, and the description in that application is incorporated herein by reference.

This invention relates to and improves on a vectorial network analyzer having at least two measuring ports, to each of which, respectively, a separate high-frequency generator is associated and whose measuring arms respectively have quad gates with associated measuring points.

Vectorial network analyzers of this type are known (for example, in German patent document (44 01 068). They operate mainly using so called heterodyning and make possible measurement of scattering parameters of a test object, in amount and phase, in a broad frequency range. All conventional network analyzers to date have used a common frequency-controllable high-frequency generator that is alternately connected to each of two separate measuring arms via a change-over switch.

In order to increase measurement speed it has been suggested to use two separate high-frequency generators that can be adjusted independently of each other by a processor and with their output signals being alternately sent to measuring ports (old German patent application 198 57 834, column 2, lines 30 through 40 and 59 through 64).

With these known network analyzers, in which the signals of a single high-frequency generator or of two separate high-frequency generators are alternately sent to the measuring ports, 20 scattering parameters of a test object cannot be measured under true operating conditions, because during the measurement of forward parameters by one measuring arm, no measuring signal is fed to the test object in the backward direction, and vice versa. Only one of the measuring ports receives a measuring signal at a time, while the other measuring port is passively terminated. Certain test objects such as amplifiers, however, exhibit other characteristics under load, that is in active operation, than are measured in this manner.

It is therefore an object of this invention to provide a vectorial network analyzer with which scattering parameters of a test object are measurable under true operating conditions.

SUMMARY OF THE INVENTION

According to Principles of this invention, a vector network analyzer has at least two measuring ports, to each of which, respectively, one separate high-frequency generator is associated. Measuring arms of the generators respectively have quad gates with accompanying measuring points. The high-frequency signals of the high-frequency generators are distinguishable from each other and are simultaneously fed to the respective measuring ports. Advantageous further enhancements involve modulating the high-frequency signals of the separate high-frequency generators differently and/or giving them different frequencies.

According to principles of the invention, a separate high-frequency generator is used for each measuring arm, and the high-frequency signals of these generators are simultaneously sent to the their associated measuring ports. In this manner, forward- and backward-direction measurements can be simultaneously carried out on any desired test object, it only being necessary that the high-frequency signals of these generators be made distinguishable from each other, for example in that they are differently modulated or in that they have different frequencies. The principle of the invention can, thereby, be used for network analyzers having only two measuring ports as well as for network analyzers having three or more measuring ports, in which case a corresponding number of additional separate high-frequency generators is required. Moreover, the principle of this invention has the advantage that a broadband HF changeover switch, which causes significant problems and disadvantages in known network analyzers, is unnecessary. Moreover, there are fewer dynamic transient oscillation problems, since level regulations do not always have to operate between the extreme ON and OFF values. With a network analyzer of this invention, the scattering parameters under true operating conditions can be recorded, for example broadband output matching during a constant high-level signal at the input of the test object. In addition, simple multiport systems can be constructed by multiplying the test and reference arms, and in a simple manner, intermodulation measurements can be made with multiple tone excitation.

BRIEF DESCRIPTION OF THE DRAWING

The invention is described and explained in more detail below using an embodiment shown in the drawing. The described and drawn features can be used individually or in preferred combinations in other embodiments of the invention. The foregoing and other objects, features and advantages of the invention will be apparent from the following more particular description of the preferred embodiment of the invention, as illustrated in the accompanying drawing. The drawing is not necessarily to scale, emphasis instead being placed upon illustrating principles of the invention in a clear manner.

DESCRIPTION OF THE PREFERRED EMBODIMENT

The FIGURE shows a schematic circuit diagram of a vectorial network analyzer, having two measuring ports 1 and 2, with two measuring arms Z1 and Z2 that are fed from separate high-frequency generators G1 and G2. The generators G1 and G2 are commonly tunable in a predetermined frequency range. Quad gates R1 and R2, structured as measuring bridges or directional couplers, for example, and with which measuring points M1 through M4 are connected, are arranged in the measuring arms Z1 and Z2, with which voltage measurements by amount and phase can be carried out on the test object. Thus, at an input and an output of the test object DUT, which is connected between the two measuring ports, respective complex reflection and transmission coefficients can be simultaneously measured in forward and backward directions. Evaluation of measurement values at the measuring ports takes place in a not-shown evaluation device.

To distinguish the high-frequency signals of the two simultaneously switched-on high-frequency generators G1 and G2, which are simultaneously applied to the test object DUT, these high-frequency signals f1 and f2 are modulated differently, for example, or differ from each other in frequency. Any modulation may be used as the different modulation, and all known modulation types that are distinguishable from each other are suitable. The frequency offset between the two high-frequency signals is preferably selected taking into consideration a desired dynamic range and resolution bandwidth of a measurement-value-processing HF receiver.

The invention claimed is:

1. A vectorial network analyzer for analyzing a test object (DUT) having at least two measuring ports (1,2) to each of which, respectively, a separate high-frequency generator (G1, G2) is associated and whose measuring arms (Z1, Z2) respectively have quad gates (R1, R2) with associated measuring points (M1 through M4), wherein the high-frequency signals ($f_1$, $f_2$) of the high-frequency generators (G1, G2) are distinguishable from each other and are fed simultaneously to the respective measuring ports (1, 2), so that at an input and an output of the test object (DUT), which is connected between the two measuring ports (1, 2), respective complex reflection and transmission coefficients are simultaneously measured in forward and backward directions.

2. A network analyzer as in claim 1, wherein the high-frequency signals of the separate high-frequency generators (G1, G2) are modulated differently.

3. A network analyzer as in claim 1, wherein the high-frequency signals of the high-frequency generators (G1, G2) differ with respect to frequency ($f_1$, $f_2$).

* * * * *